(12) United States Patent
Fukami et al.

(10) Patent No.: US 12,681,371 B2
(45) Date of Patent: Jul. 14, 2026

(54) COOLING APPARATUS, LIGHT SOURCE APPARATUS, AND PROJECTOR

(71) Applicant: CASIO COMPUTER CO., LTD., Tokyo (JP)

(72) Inventors: Yuta Fukami, Fussa (JP); Tomoyuki Ueda, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 594 days.

(21) Appl. No.: 18/099,629

(22) Filed: Jan. 20, 2023

(65) Prior Publication Data

US 2023/0236485 A1 Jul. 27, 2023

(30) Foreign Application Priority Data

Jan. 25, 2022 (JP) ................................. 2022-009037

(51) Int. Cl.
*G03B 21/16* (2006.01)
*G03B 21/20* (2006.01)
*H05K 7/20* (2006.01)

(52) U.S. Cl.
CPC ............. *G03B 21/16* (2013.01); *G03B 21/20* (2013.01); *H05K 7/20336* (2013.01); *H05K 7/2039* (2013.01)

(58) Field of Classification Search
CPC ... G03B 21/16; H05K 7/20336; H05K 7/2039
USPC ........................................................ 353/52
See application file for complete search history.

(56) References Cited

U.S. PATENT DOCUMENTS

| | | | | |
|---|---|---|---|---|
| 8,002,019 B2 * | 8/2011 | Min | ...................... | H01L 23/467 |
| | | | | 165/104.33 |
| 2015/0109584 A1 * | 4/2015 | Murai | .................. | H04N 9/3161 |
| | | | | 353/31 |
| 2017/0284738 A1 * | 10/2017 | Watanabe | ........... | F28D 15/0275 |
| 2021/0318072 A1 * | 10/2021 | Ito | ...................... | H05K 7/20409 |

FOREIGN PATENT DOCUMENTS

| | | | | | |
|---|---|---|---|---|---|
| JP | 3162275 | U | 8/2010 | | |
| JP | 2013138081 | A | 7/2013 | | |
| JP | 2015161448 | A | 9/2015 | | |
| JP | 2017020742 | A | * 1/2017 | ............. | F28D 15/02 |
| JP | 2017138525 | A | 8/2017 | | |

OTHER PUBLICATIONS

Translation of 2017020742 (Year: 2025).*
Notice of Reasons for Refusal dated Dec. 12, 2023 received in Japanese Patent Application No. JP 2022-009037.

* cited by examiner

*Primary Examiner* — Jerry L Brooks
(74) *Attorney, Agent, or Firm* — Scully, Scott, Murphy & Presser, P.C.

(57) ABSTRACT

A first cooling apparatus includes a first heat sink having multiple first fins having a U-shaped opening and an O-shaped opening which are provide therein, a first heat receiving member configured to be brought into abutment with a heat source, and a first heat pipe which extends from one end which is connected with the heat receiving member towards the other end, and the first heat pipe has a first extending portion which extends from the one end, a bent portion which is bent from the first extending portion and at least a part of which is disposed inside the U-shaped opening, and a second extending portion which extends from the bent portion and at least a part of which is disposed inside the O-shaped opening.

20 Claims, 9 Drawing Sheets

COOLING APPARATUS, LIGHT SOURCE APPARATUS, AND PROJECTOR

CROSS-REFERENCE TO RELATED APPLICATION

This patent application is based upon and claims the benefit of priority under 35 USC 119 to Japanese Patent Application No. 2022-009037 filed on Jan. 25, 2022, and the content thereof, including the specification, claims, drawings and abstract, is incorporated herein by reference in its entirety.

BACKGROUND OF THE INVENTION

Technical Field

The present disclosure relates to a cooling apparatus, a light source apparatus, and a projector.

Description of the Related Art

There have conventionally been proposed cooling apparatuses for cooling an inner part of an electronic apparatus such as a projector or the like. This type of cooling apparatus is made up of a heat sink having multiple fins, and a heat pipe connected to the heat sink, and the like.

SUMMARY OF THE INVENTION

According to an aspect of the present disclosure, there is provided a cooling apparatus including a heat sink having multiple fins each having an opening provided therein, a heat receiving member configured to be brought into abutment with a heat source, and a heat pipe which extends from one end which is connected to the heat receiving member towards the other end thereof, wherein the heat pipe includes a first extending portion which extends from the one end, a bent portion which is bent from the first extending portion and at least a part of which is disposed inside the openings, and a second extending portion which extends from the bent portion and at least a part of which is disposed inside the openings.

According to another aspect of the present disclosure, there is provided a light source apparatus including the cooling apparatus described above, and a light source configured to emit light having a wavelength in a red wavelength range, light having a wavelength in a blue wavelength range, and light having a wavelength in a green wavelength range.

According to a further aspect of the present disclosure, there is provided a projector including the light source apparatus described above, a display device configured to form image light by receiving light source light emitted from the light source apparatus, a projection optical system configured to project the image light emitted from the display device onto a projection target object, and a control unit configured to control the display device and the light source apparatus.

DESCRIPTION OF THE EMBODIMENT

Figure 1:
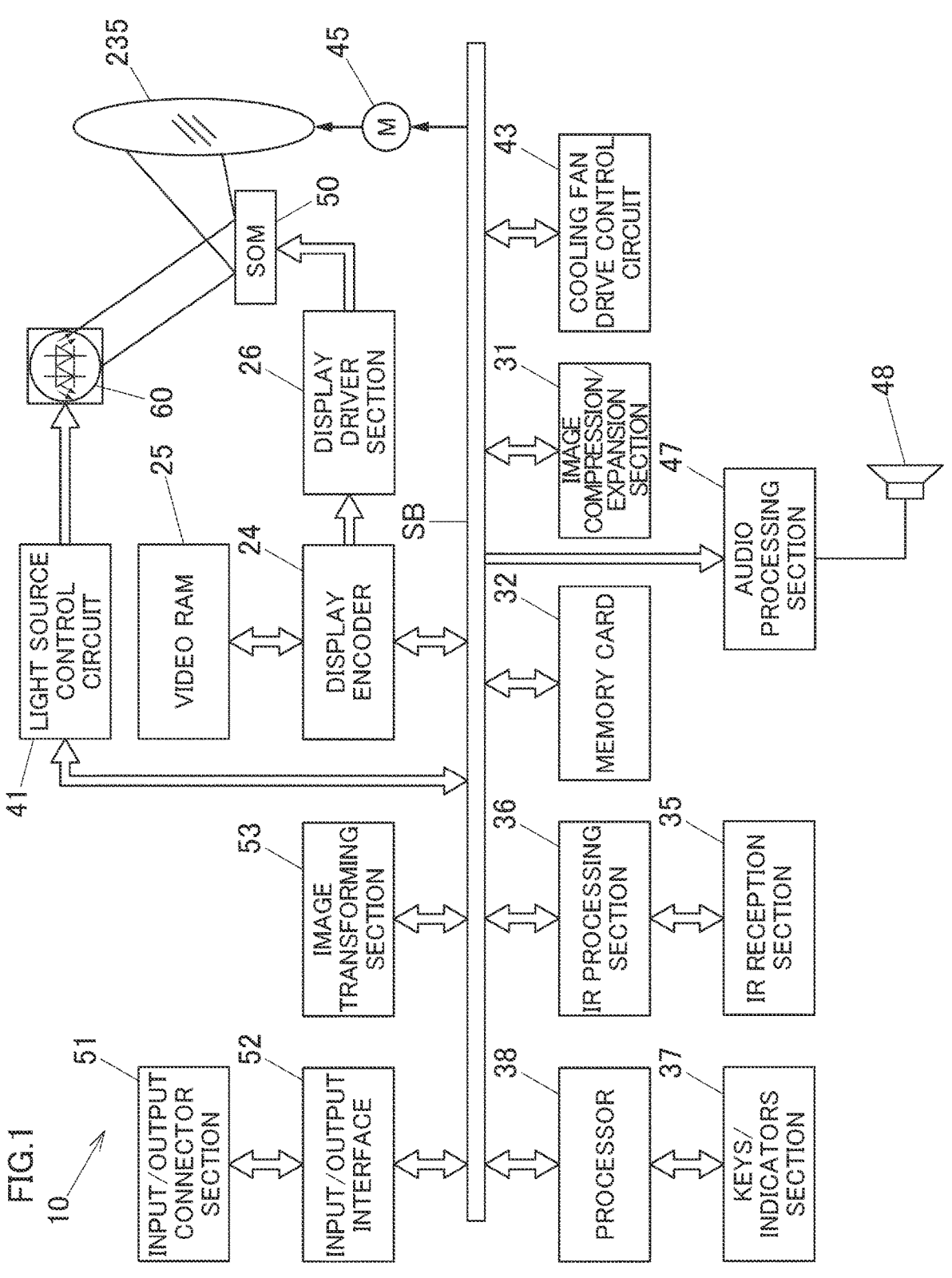
FIG. 1 is a diagram showing functional circuitry blocks of a projector according to an embodiment.

Hereinafter, referring to FIGS. 1 to 6, an embodiment of the present disclosure will be described. FIG. 1 is a diagram showing functional circuitry blocks of a projector 10. A projector control unit includes a central processing unit (CPU) which includes an image transforming section 53 and a control section 38, a front-end unit which includes an input/output interface 52, and a formatter unit which includes a display encoder 24 and a display drive section 26. Image signals of various standards which are input from an input/output connector section 51 are sent to the image transforming section 53 via the input/output interface 52 and a system bus SB, and the image signals so sent are then transformed so as to be unified into an image signal of a predetermined format which is suitable for display in the image transforming section 53. Thereafter, the unified image signal of the predetermined format is output to the display encoder 24.

The display encoder 24 deploys the image signal which is input thereinto on a video random access memory (RAM) 25 for storage therein and then generates a video signal from the contents stored in the video RAM 25, outputting the video signal so generated to the display drive section 26.

The display drive section 26 drives a display device 50, which is a spatial optical modulator (SOM), at an appropriate frame rate in response to the image signal output from the display encoder 24. The display device 50 is, for example, a digital micromirror device (DMD). The projector 10 is such that light emitted from a light source apparatus 60 is illuminated onto the display device 50 via a light guiding optical system 180, whereby an optical image is formed by light which is reflected by the display device 50, and the optical image so formed is then projected via a projection optical system 220 onto a projection target object such as a screen, not shown, so as to be displayed on the screen. Here, a movable lens group 235 of the projection optical system 220 can be driven using a lens motor 45 for zooming and focusing.

An image compression/expansion section 31 performs a recording process in which a luminance signal and a color difference signal of the image signal are data compressed through processing such as Adaptive Discrete Cosine Transform (ADCT), Huffman coding, and the like, and the compressed data is then sequentially written on a memory card 32, which is a detachable recording medium. Further, with the projector 10 set in a reproducing mode, the image compression/expansion section 31 reads out the image data recorded in the memory card 32 and expands the individual image data that makes up a series of dynamic images frame by frame, outputting the image data so expanded to the display encoder 24 by way of the image transforming section 53. As a result, the image compression/expansion section 31 can output the dynamic images or the like based on the image data stored in the memory card 32.

The control section 38 governs the control of operations of individual circuitries inside the projector 10 and is made up of a central processing unit (CPU), a read only memory (ROM) for fixedly storing operation programs such as various settings or the like, a random access memory (RAM) used as a work memory, and the like.

A keys/indicators section 37 is made up of main keys and indicators which are provided on a housing 20 of the projector 10. Operation signals of the keys/indicators section 37 are sent out directly to the control section 38. Key operation signals from a remote controller are received by an Ir reception section 35 and are demodulated into code signals in an Ir processing section 36, which are then output to the control section 38.

The control section 38 is connected with an audio processing section 47 by way of the system bus SB. This audio processing section 47 includes a circuitry for a sound source such as a PCM sound source or the like. With the projector 10 set in a projection mode and the reproducing mode, the audio processing section 47 converts audio data into analog signals and drives a speaker 48 so as to output sound or voice loudly therefrom.

The control section 38 controls a light source control circuit 41. The light source control circuit 41 controls separately operations of an excitation light illuminating device (a light source) 70, a red light source device (a light source) 80, a luminescent wheel device 100, and the like of the light source apparatus 60 so as to enable the light source apparatus 60 to emit lights in predetermined wavelength ranges which are required in generating an image.

Further, the control section 38 causes a cooling fan drive control circuit 43 to detect temperatures using multiple temperature sensors provided in the light source apparatus 60 and the like, so that the rotation speed of a cooling fan 300 (refer to FIG. 3) is controlled based on the results of the temperature detections so carried out. Additionally, the control section 38 causes the cooling fan drive control circuit 43 to keep the cooling fan 300 rotating using a timer or the like even after a power supply to a main body of the projector 10 is switched off or causes the cooling fan control circuit 43 to switch off the power supply to the main body of the projector 10 depending on the results of the temperature detections carried out by the temperature sensors.

Figure 2:
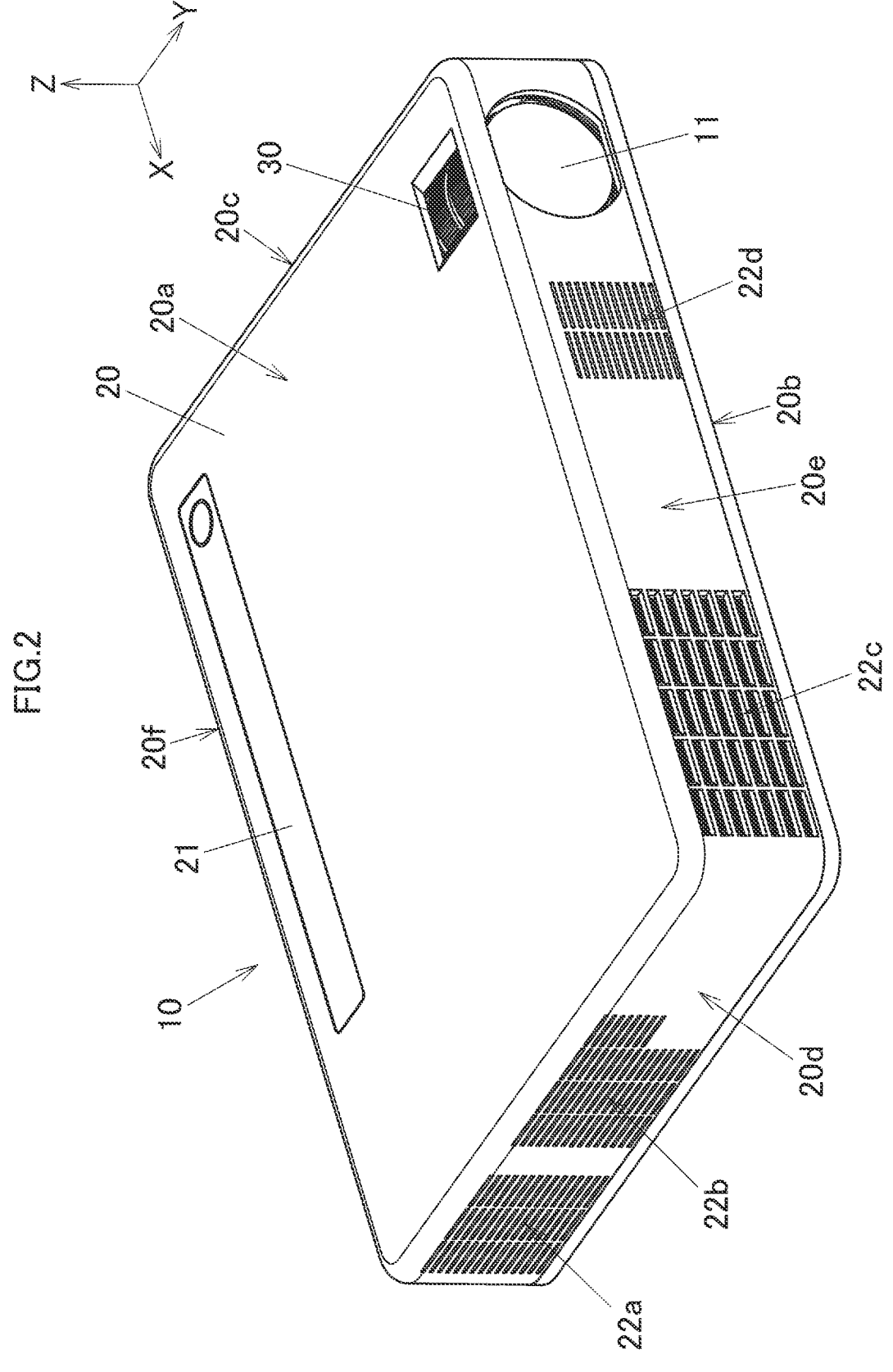
FIG. 2 is a perspective view showing an external appearance of the projector according to the embodiment.

Next, the configuration of the projector 10 will be described. As shown in FIG. 2, this projector 10 includes the housing 20 of a substantially rectangular box shape which is elongated in a left-right direction, and the housing 20 has six sides or surfaces (an upper surface 20a, lower surface 20b, a left surface 20c, a right surface 20d, a front surface 20e, and a rear surface 20f). In addition, the projector 10 has a projection port 11 in the front surface 20e thereof. The projector 10 emits projected light from the projection port 11. In the following description, when directions are described with respect to the projector 10 while referring to the accompanied drawings, an X-axis direction is referred to as the left-right direction (an X-axis positive direction is referred to as a right direction) of the projector 10, a Y-axis direction is referred to as a front-rear direction (a Y-axis positive direction is referred to as a front direction) of the projector 10, and a Z-axis direction is referred to as an up-down direction (a Z-axis positive direction is referred to as an up direction) of the projector 10.

An operating panel 21 is provided in the upper surface 20a of the housing 20 for use in setting the projector 10 in various modes. Four corners of the upper surface 20a are rounded. A first outside air intake port 22a and a second outside air intake port 22b are provided in the right surface 20d. An opening for the projection port 11, a third outside air intake port 22c, and a first inside air outlet port 22d are provided in the front surface 20e. A lens barrel 200 is accommodated in the housing 20 (refer to FIG. 3). The lens barrel 200 includes a movable adjustment ring 30 which is provided on the lens barrel 200.

Figure 3:
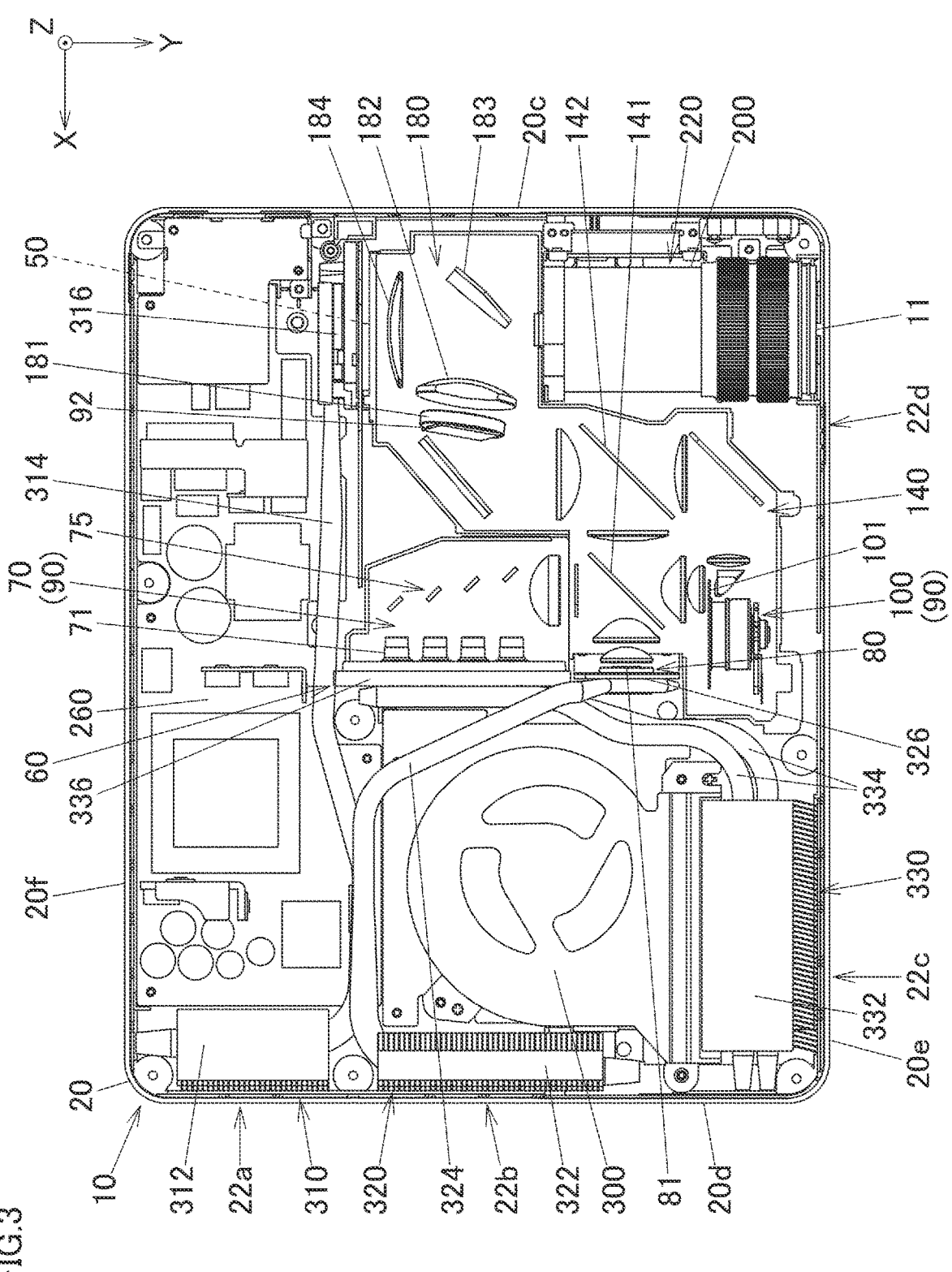
FIG. 3 is a schematic plan view showing an internal structure of the projector according to the embodiment.

Next, referring to FIG. 3, an internal structure of the projector 10 will be described. As shown in FIG. 3, the projector 10 includes the light source apparatus 60, which is provided at a portion lying substantially centrally in the left-right direction and closer to the front surface 20e in the housing 20. The light guiding optical system 180 and the projection optical system 220 are disposed between the light source apparatus 60 and the left surface 20c. A control circuit board 260, on which the control section 38 and the like are mounted, is disposed at a rear portion inside the housing 20. In addition, the projector 10 includes a first cooling apparatus 310 for cooling the display device 50 at a right-hand side of the control circuit board 260, a second cooling apparatus 320 for cooling the red light source device 80 at a portion lying closer to the right surface 20d of the housing 20, and a third cooling apparatus 330 for cooling the excitation light illuminating device 70. Further, the projector 10 includes the cooling fan 300 at a portion which is surrounded by the light source apparatus 60, the control circuit board 260, the second cooling apparatus 320, and the third cooling apparatus 330 (at a right-hand side portion of the housing 20).

The light source apparatus 60 includes the excitation light illuminating device 70, which constitutes not only a light source of light having a wavelength in the blue wavelength range or simply light in the blue wavelength range but also a light source of excitation light, the red light source device 80, which constitutes a light source of light having a wavelength in the red wavelength range or simply light in the red wavelength range, and a green light source device (a light source) 90, which constitutes a light source of light having a wavelength in the green wavelength range or simply light in the green wavelength range. The green light source device 90 is made up of the excitation light illuminating device 70 and the luminescent wheel device 100. In addition, a light guiding optical system 140, which is configured to guide light in the blue wavelength range, light in the red wavelength range, and light in the green wavelength range, is disposed in the light source apparatus 60. The light source optical system 140 has multiple lens groups as multiple lenses, two dichroic mirrors 141, 142, and multiple reflection mirrors. The light source optical system 140 collects lights emitted from the blue, red, and green light source devices (the excitation light illuminating device 70, the red light source device 80, and the green light source device 90) onto an incident surface of a microlens array 92, which is disposed at an emerging side of the light source optical system 140.

The excitation light illuminating device 70 is disposed in a position which is situated at a substantially central portion of the housing 20 of the projector 10 in the left-right direction and closer to the rear surface 20f. The excitation light illuminating device 70 has a light source group of blue laser diodes 71, a reflection mirror group 75, a lens group, and the like. The light source group is formed of multiple blue laser diodes 71, which are semiconductor light emitting elements and are disposed in such a manner that optical axes thereof become parallel to the rear surface 20f. The reflection mirror group 75 has multiple reflection mirrors which are arranged into a ladder-like configuration and is configured to reflect lights emitted from the blue laser diodes 71 while narrowing an effective diameter of each of the lights in one direction. The reflection mirror group 75 changes directions of axes of the lights emitted from the individual blue laser diodes 71 through about 90 degrees towards the front surface 20e.

The red light source device 80 has a red light emitting diode 81, which is disposed in such a manner that an optical axis thereof becomes parallel to those of the blue laser diodes 71, and a collective lens group for collecting light emitted from the red light emitting diode 81. The red light source device 80 is disposed in such a manner that an axis of light in the red wavelength range emitted from the red light source 80 intersects an axis of light in the blue wavelength range which is emitted from the excitation light illuminating device 70 and an axis of light in the green wavelength range emitted from a luminescent wheel 101.

The luminescent wheel device 100, which makes up the green light source device 90, is disposed on a light path of light in the blue wavelength range which is emitted from the excitation light illuminating device 70 and in the vicinity of the front surface 20e. The luminescent wheel device 100 has the luminescent wheel 101, which is disposed in such a manner as to become parallel to the front surface 20e (in other words, in such a manner as to intersect an axis of light emitted from the excitation light illuminating device 70 at right angles), a motor, not shown, for rotationally driving the luminescent wheel 101, and a drive control device, not shown, for controlling the drive of the motor 110. A collective lens group and a lens member are disposed on a side of the luminescent wheel device 100 from which light is emitted. Here, the drive control device is controlled by the light source control circuit 41 described above.

The light guiding optical system 180 has a concave lens 181, a convex lens 182, a reflection mirror 183, and a condenser lens 184. Here, the condenser lens 184 emits image light, which is emitted from the display device 50 disposed on a side of the condenser lens 184 which faces the rear surface 20f, towards the projection optical system 220, and hence, the condenser lens 184 is also regarded as a part of the projection optical system 220. The concave lens 181 is disposed between the microlens array 92 and the convex lens 182 (in other words, a light path between the microlens array 92 and the display device 50). In addition, the convex lens 182 is disposed between the concave lens 181 and the reflection mirror 183 (in other words, the light path between the microlens array 92 and the display device 50).

The projection optical system 220 is made up of the condenser lens 184, the movable lens group, and a fixed lens group. The fixed lens group, which is disposed on an optical axis of the condenser lens 184 which is situated on a side of the condenser lens 184 which faces the front surface 20e, is incorporated within a fixed lens barrel and is moved manually via the adjustment ring 30 described above or automatically for zooming and focusing.

Next, a cooling structure of the projector 10 will be described. The first cooling apparatus 310 has a first heat sink 312, a first heat pipe 314, and a first heat receiving member 316. The second cooling apparatus 320 has a second heat sink 322, a second heat pipe 324, and a second heat receiving member 326. The third cooling apparatus 330 has a third heat sink 332, a third heat pipe 334, and a third heat receiving member 336. The individual heat pipes 314, 324, 334 each constitute a tubular member which extends while being bent at multiple locations. One ends of the heat pipes 314, 324, 334 are connected with the corresponding heat receiving members 316, 326, 336, and the other ends thereof are passed through the corresponding heat pipes 312, 323, 332. The individual heat receiving members 316, 326,336 are connected with corresponding heat sources (the display device 50, the red light source device 80, and the blue laser diodes 71) directly or indirectly via a cushion member.

Refrigerants, not shown, flow inside the heat pipes 314, 324, 334. The refrigerants take heat from the corresponding heat sources via the corresponding heat receiving members 316, 326, 336 to thereby be evaporated at the one ends of the heat pipes 314, 324, 334 and move towards the other ends of the heat pipes 314, 324, 334 where the temperature is lower (towards the corresponding heat sinks 312, 322, 332). The evaporated refrigerants which have moved to the other ends of the heat pipes 314, 324, 334 are then cooled to be liquified by outside air taken in from the outside air intake ports 22a, 22b, 22c at the corresponding heat sinks 312, 322, 332 which are disposed in the vicinity of the corresponding outside air intake ports 22a, 22b, 22c, and then move to the one ends of the heat pipes 314, 324, 334 again. In this way, the refrigerants inside the heat pipes 314, 324, 334 move backwards and forwards between the one ends and the other ends of the heat pipes 314, 324, 334, whereby the heat at the heat sources is taken away to be reduced by the corresponding cooling apparatuses 310, 320, 330.

Figure 4:
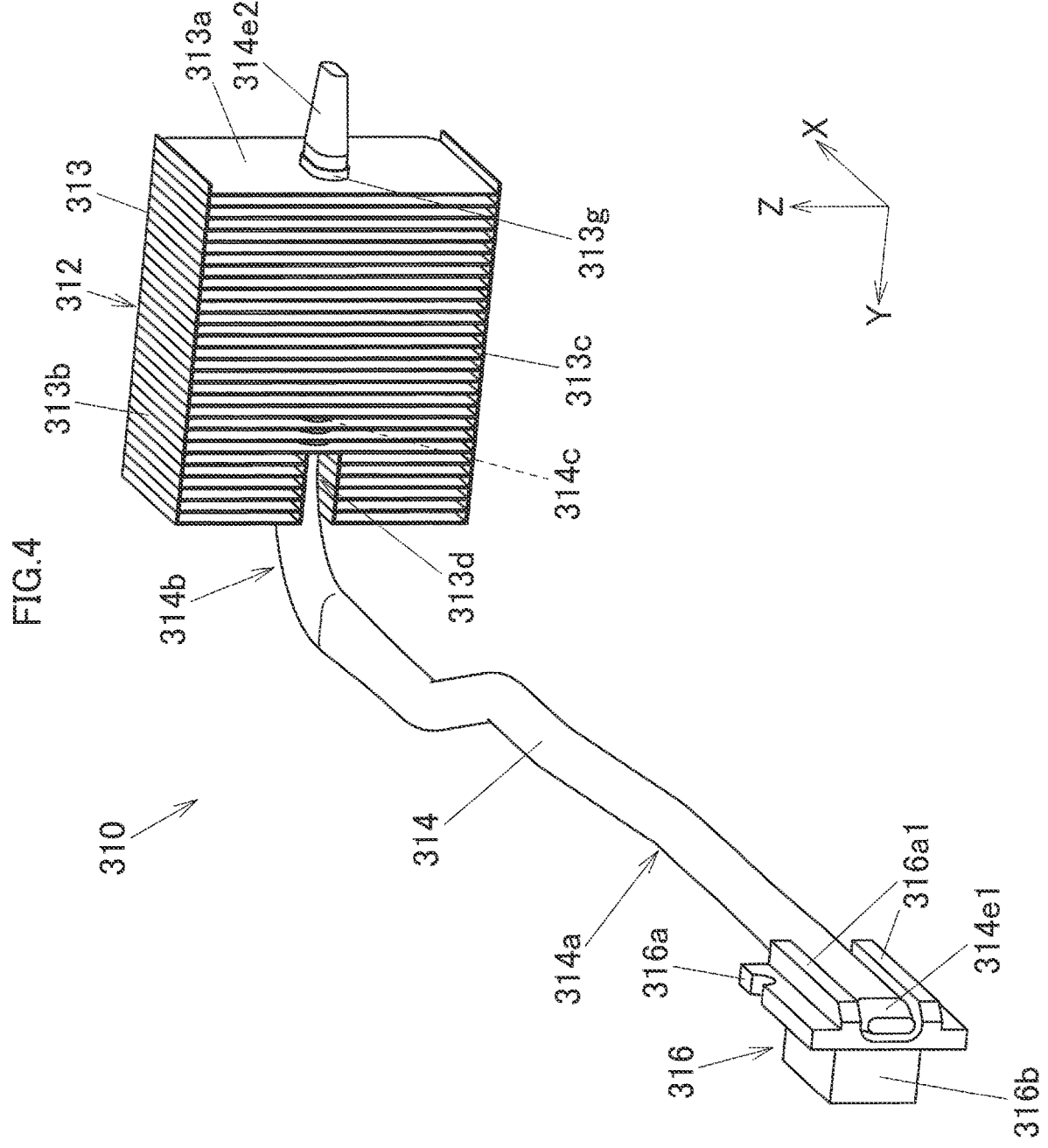
FIG. 4 is a perspective view of a first cooling apparatus according to the embodiment.
Figure 5:
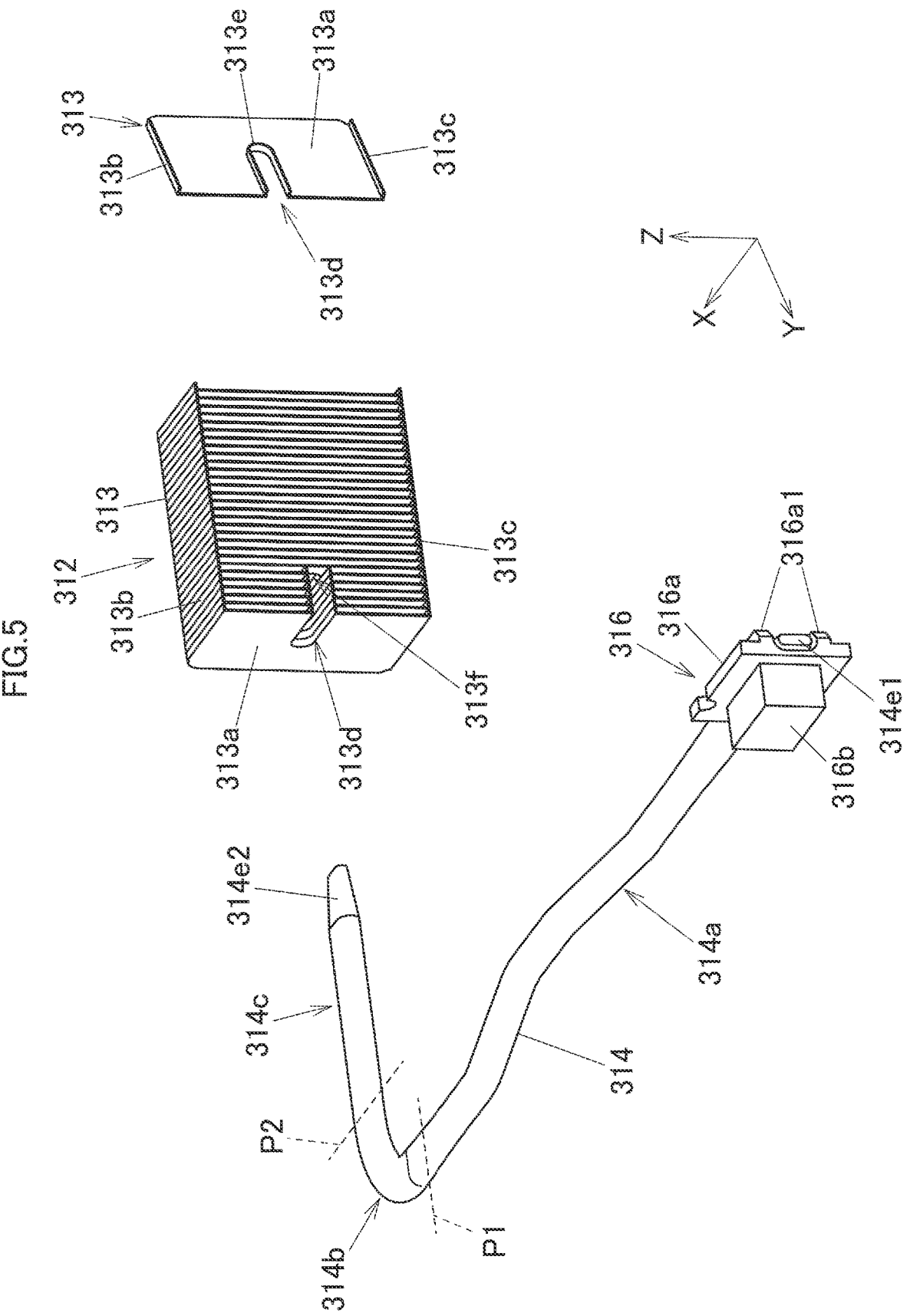
FIG. 5 is an exploded perspective view of the first cooling apparatus of the embodiment.

The respective configurations of the cooling apparatuses 310, 320, 330 will be described in detail. As shown in FIGS. 4 and 5, in the first cooling apparatus 310, the first heat sink 312 is made up by stacking multiple first fins 313 of a vertically elongated plate-like shape at regular intervals in a normal direction thereof in such a manner as to be aligned in parallel, whereby the first heat sink 312 is formed substantially into a rectangular parallelepiped object as a whole. The first fin 313 has a plate-shaped portion 313a of a plate-like shape, an upper projecting portion 313b which results by bending an upper edge portion of the plate-shaped portion 313a through about 90 degrees towards one surface side of the plate-shaped portion 313a, and a lower projecting portion 313c which results by bending a lower edge portion of the plate-shaped portion 313a through about 90 degrees towards the one surface side of the plate-shaped portion 313a.

Multiple first fins 313, which are disposed at one end part of the heat sink 312 in the direction in which the first fins 313 are aligned in parallel, each have a U-shaped opening (an opening) 313d, which is provided in a substantially central portion in the up-down direction of the plate-shaped portion 313a. The U-shaped opening 313d is opened to the left (in a predetermined direction), and an opening edge of the U-shaped opening 313d forms substantially a horizontal U-shape. A U-shaped opening projecting portion 313e is provided along the opening edge of the U-shaped opening 313d by bending an opening edge portion through about 90 degrees towards the one surface side of the plate-shaped portion 313a in such a manner as to project therefrom. In addition, in the first fins 313 which make up the first heat sink 312, first fins 313 which have no U-shaped opening formed therein each have an O-shaped opening (an opening, a through-hole) 313f which is provided in a substantially central portion in the up-down direction of the plate-shaped portion 313a. An opening edge of the O-shaped opening 313f is not opened in any directions and hence forms a through-hole which is opened into an O-like shape. An O-shaped opening projecting portion 313g is provided along the opening edge of the O-shaped opening 313f by bending an opening edge portion of the O-shaped opening 313f through about 90 degrees towards the one surface side of the plate-shaped portion 313a in such a manner as to project therefrom (refer to FIG. 4). The U-shaped openings 313d and the O-shaped openings 313f which are provided in the multiple first fins 313 are opened along the front-rear direction of the projector 10.

In the first fin 313, the upper projecting portion 313b, the lower projecting portion 313c, the U-shaped opening projecting portion 313g, and the O-shaped opening projecting portion 313g have substantially the same projecting length. Then, the first fins 313 are provided in parallel to one another in such a manner that an upper projecting portion 313b, a lower projecting portion 313c, a U-shaped opening projecting portion 313e, and an O-shaped opening projecting portion 313g of one first fin 313 are brought into abutment with a plate-shaped portion 313a of an adjacent first fin 313 via an adhesive or the like. As a result, an interval defined between adjacent first fins 313 becomes equal to the projecting lengths of the upper projecting portion 313b, the lower projecting portion 313c, the U-shaped opening projecting portion 313g, and the O-shaped opening projecting portion 313g, whereby the first fins 313 are aligned at regular intervals. In the first heat sink 312, the multiple first fins 313 in which the U-shaped opening 313d is provided are continuously provided in parallel at the front end part (a part closer to the left end of the heat sink 312), and the multiple first fins 313 in which the O-shaped opening 313f is provided are continuously provided in parallel at the other parts of the heat sink 312.

By providing the first fins 313 in parallel in the way described heretofore, the U-shaped openings 313d and the O-shaped openings 313f which are provided in the first fins 313 are made to correspond to one another in such a manner as to communicate with one another in the normal direction of the plate-shaped portions 313a. Then, the first heat sink 312, which is configured as described above, is disposed between the control circuit board 260 and the right surface 20d inside the projector 10 in such an orientation that the respective normal directions of the plate-shaped portions 313a extend along the right surface 20d of the projector 10 and is hence disposed in the vicinity of the first outside air intake port 22a (refer to FIG. 3).

The first heat receiving member 316 has a plate-shaped heat receiving portion 316a and a heat receiving portion 316b which projects substantially into a rectangular parallelepiped shape from one plate surface of the heat receiving portion 316a. A holding portion 316a1, which is configured to hold one end 314e1 of the first heat pipe 314 in the up-down direction, is provided in the other plate surface of the heat receiving portion 316a. The heat receiving portion 316b is connected with the display device 50 directly or indirectly.

The one end 314e1 of the first heat pipe 314 is held by the holding portion 316a1 of the first heat receiving member 316 from above and below to thereby be connected to the heat receiving member 316, and the other end thereof is passed through the U-shaped openings 313d and the O-shaped openings 313f in the first fins 313 to thereby be exposed from the first heat sink 312. The first heat pipe 314 has a first extending portion 314a which extends along the left-right direction (a first direction) from the one end 314e1, a bent portion 314b which is bent through about 90 degrees to the rear from the first extending portion 314a, and a second extending portion 314c which extends along the front-rear direction (a second direction) from the bent portion 314b to the other end 314e2 and which is passed through the first heat sink 312. When it is referred to herein, the bent portion 314b refers to a portion which is defined, as shown in FIG. 5, from a point P1 where the extending direction of the first heat pipe 314 is changed from an orientation in which the extending direction follows the left-right direction to an orientation in which the extending direction is started to be bent towards the rear to a point P2 where the bending of the extending direction ends and the extending direction takes an orientation in which the extending direction of the first heat pipe 314 follows the front-rear direction.

In a fabrication process of the first heat pipe 314, collapsing work is applied to the first heat pipe 314 from the bent portion 314b towards the other end 314e2, whereby the bent portion 314b and the second extending portion 314c are compressed in the up-down direction (a direction perpendicular to the left-right direction and the front-rear direction) to thereby be formed into a flat shape. In addition, in the collapsing step described above, a distal end portion of the second extending portion 314c (the other end 314e2 of the first heat pipe 314) is formed into a narrowed shape towards a distal end thereof. A vertical opening width of the U-shaped opening 313d of the first fin 313 is made substantially the same as a vertical thickness of the bent portion 314b of the first heat pipe 314 which is compressed into the flat shape. An opening size and an opening shape of the O-shaped opening 313f of the first fin 313 are made substantially the same as an outer circumferential size and an outer circumferential shape of the second extending portion 314c of the first heat pipe 314 which is compressed into the flat shape.

Here, an assembling manner of assembling the first heat sink 312 and the first heat pipe 314 together will be described. The first heat pipe 314 is assembled to the first heat sink 312 by passing the second extending portion 314c and a part of the bent portion 314b of the first heat pipe 314 through the U-shaped openings 313d and the O-shaped openings 313f which are provided in the first heat sink 312 so as to be soldered thereto. To describe this in detail, in the first heat pipe 314, the part of the bent portion 314b which lies closer to the second extending portion 314c is disposed inside the U-shaped openings 313d and the second extending portion 313c is disposed inside the O-shaped openings 313f in such a manner as to contact the O-shaped openings 313f. In other words, in the first heat sink 312, the first fins 313 are provided not only in the position which corresponds to the second extending portion 314c but also in a position which corresponds to the part of the bent portion 314b.

The part of the bent portion 314b of the first heat pipe 314 which is disposed inside the U-shaped openings 313d is in abutment with the U-shaped opening projecting portions 313e of the first fins 313 over substantially whole areas of an upper surface and a lower surface thereof. In addition, the second extending portion 314c of the first heat pipe 314, that is, the portion of the first heat pipe 314 which is disposed inside the O-shaped openings 313f in the first heat sink 312 is in abutment with the O-shaped opening projecting portions 313g of the first fins 313 over substantially a whole area of an outer circumferential surface thereof. Here, as a result of the other end 314e2 of the first heat pipe 314 being narrowed as described above, the first heat pipe 314 can easily be passed through the U-shaped openings 313d and the O-shaped openings 313f in the assembling step of assembling the first heat sink 312 and the first heat pipe 314 together. When it is referred to in the present disclosure, the "abutment" between the heat pipe and the fins includes not only a direct abutment in which the heat pipe and the fins are brought into direct abutment with each other but also an indirect abutment in which the heat pipe and the fins are brought into indirect abutment with each other while lying close to each other with a fixing member such as a solder interposed therebetween.

Figure 6:
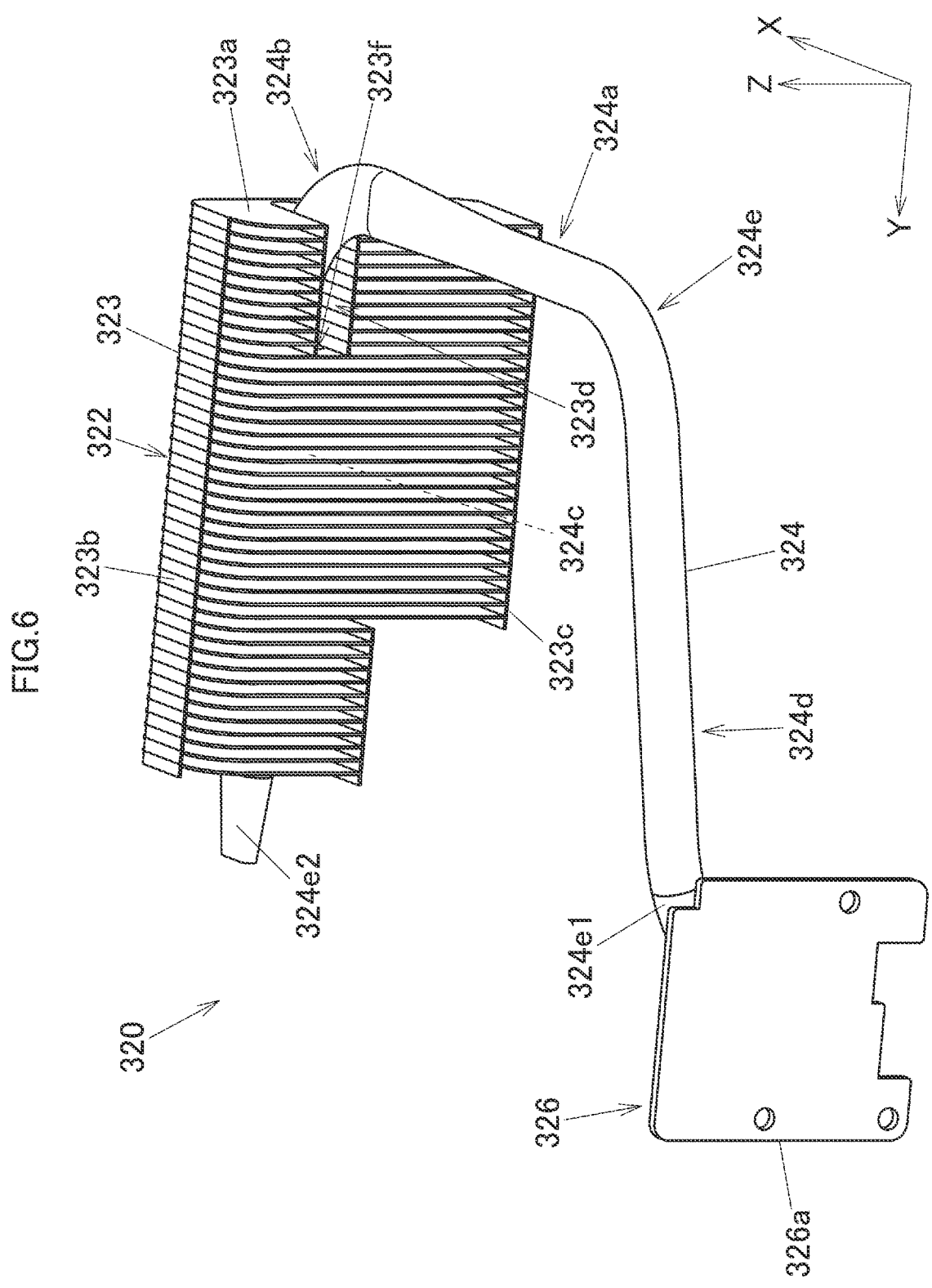
FIG. 6 is a perspective view of a second cooling apparatus according to the embodiment.

Next, the configuration of the second cooling apparatus 320 will be described. As shown in FIG. 6, the second heat sink 322 is made up by stacking multiple second fins 323 of a vertically elongated plate-like shape at regular intervals in a normal direction thereof in such a manner as to be aligned in parallel, whereby the second heat sink 322 is formed substantially into a rectangular parallelepiped object as a whole. In the multiple second fins 323, second fins 323 which are provided in parallel at a front part (a part closer to a left end shown in FIG. 6) of the second heat sink 322 each have a vertical length which is substantially a half of a vertical length of each of second fins 323 which are provided other parts of the second heat sink 322. As with the first fin 313 of the first heat sink 312, each of the second fins 323 has a plate-shaped portion 323a, an upper projecting portion 323b, a lower projecting portion 323c, a U-shaped opening 323d, a U-shaped opening projecting portion 323e, an O-shaped opening 323f, and an O-shaped opening projecting portion 323g.

In the second heat sink 322, multiple second fins 323 each having the U-shaped openings 323d provided therein are continuously provided in parallel at a rear end part (a part closer to a rear end in FIG. 6), and multiple second fins 323 each having the O-shaped openings 323f provided therein are continuously provided in parallel at the other or remaining part. The second heat sink 322 is disposed between the cooling fan 300 and the right surface 20d inside the projector 10 in such an orientation that the direction of a normal line of each plate-shaped portion 323a follows the right surface 20d of the projector 10 and lies close to the second outside air intake port 22b (refer to FIG. 3). The second heat receiving member 326 has a heat receiving plate portion 326a of a substantially square plate shape. One plate surface of the heat receiving plate portion 326a is connected directly or indirectly with the red light source device 80.

One end 324e1 of the second heat pipe 324 is connected with the other plate surface of the heat receiving plate portion 326a of the second heat receiving member 326, and the other end 324e2 thereof is passed through the U-shaped openings 323d and the O-shaped openings 323f in the second fins 323 so as to be exposed from the second heat sink 322. A one-end side extending portion 324d, which extends obliquely rightwards to the rear, and a one-end side bent portion 324e, which is bent to the right from the one-end side extending portion 324d, are provided at a part of the second heat pipe 324 which lies closer to the one end thereof. Further, the second heat pipe 324 has a first extending portion 324a, which extends from the one-end side bent portion 324e along the left-right direction (the first direction), a bent portion 324b, which is bent through about 90 degrees to the front from the first extending portion 324a, and a second extending portion 324c, which extends from the bent portion 324b towards the other end 324e2 along the front-rear direction (the second direction) while being passed through the second heat sink 322.

As with the first heat pipe 314, the second heat pipe 324 is compressed in the vertical direction (the direction perpendicular to the left-right direction and the front-rear direction) at the bent portion 324b and the second extending portion 324c, whereby the part of the second heat pie 324 which corresponds to the relevant portions is formed into a flat shape, and a distal end portion of the flat part (the other end 324e2 of the second heat pipe 324) is narrowed gradually towards a distal end during the collapsing step of collapsing or compressing the relevant portions of the second heat pipe 324. A vertical opening width of the U-shaped opening 323d of the second fin 323 which makes up the second heat sink 322 is made substantially the same as a vertical thickness of the bent portion 324b of the second heat pipe 324 which is compressed into the flat shape. An opening size and an opening shape of the O-shaped opening 323f of the second fin 323 are made substantially the same as an outer circumferential size and an outer circumferential shape of the second extending portion 324c of the second heat pipe 324 which is compressed into the flat shape.

The second heat pipe 324 is assembled to the second heat sink 322 by passing the second extending portion 324c and a part of the bent portion 324b of the second heat pipe 324 through the U-shaped openings 323d and the O-shaped openings 323f which are provided in the second heat sink 322 so as to be soldered thereto. To describe this in detail, in the second heat pipe 324, the part of the bent portion 324b which lies closer to the second extending portion 324c is disposed inside the U-shaped openings 323d and the second extending portion 323c is disposed inside the U-shaped openings 323d and the O-shaped openings 323f in such a manner as to contact the O-shaped openings 323f. In other words, in the second heat sink 322, the second fins 323 are provided not only in the position which corresponds to the second extending portion 324c but also in a position which corresponds to the part of the bent portion 324b.

The part of the bent portion 324b of the second heat pipe 324 which is disposed inside the U-shaped openings 323d is in abutment with the U-shaped opening projecting portions 323e of the second fins 323 over substantially whole areas of an upper surface and a lower surface thereof. In addition, the second extending portion 324c of the second heat pipe 324, that is, the portion of the second heat pipe 324 which is disposed inside the O-shaped openings 323f in the second heat sink 322 is in abutment with the O-shaped opening projecting portions 323g of the second fins 323 over substantially a whole area of an outer circumferential surface thereof.

Here, the third heat sink 332 which makes up the third cooling apparatus 330 is disposed between the cooling fan 300 and the front surface 20e inside the projector 10 and lies close to the third outside air intake port 22c (refer to FIG. 3). The third heat receiving member 336 is connected directly or indirectly with the blue laser diodes 71. The third heat pipe 334 is made up of two pipes which are disposed in parallel to each other. One end of the third heat pipe 334 is connected with the third heat receiving member 336, and the other end thereof is passed through the third heat sink 332 so as to be exposed towards the right surface 20d from the third heat sink 332.

Here, with a heat pipe of a conventional cooling apparatus, due to a limited interior space of an electronic device such as a projector, it happens from time to time that the heat pipe is disposed in the interior space in such a manner as to be bent at multiple locations. With this heat pipe, a heat sink having fins is disposed only at straight-line parts of the heat pipe. As a result, the disposition of the fins is limited, whereby the interior space of the electronic device such as the projector could not be used effectively in order to enhance the heat dissipation effect of the cooling apparatus via the multiple fins.

Thus, as has been described heretofore, the various members are disposed inside the projector 10, and the individual heat sinks 312, 322, 332 are required to be disposed close to the corresponding outside air intake ports 22a, 22b, 22c. To make this happen, the space where to dispose the cooling apparatuses 310, 320, 330 is limited inside the projector 10. Then, with the first cooling apparatus 310 and the second cooling apparatus 320 according to the embodiment of the present disclosure, the heat sinks 312, 322 are provided even in the position which corresponds to the part of the bent portions 314b, 324b of the heat pipes 314, 324, and the first fins 313 (the second fins 323) are provided on the whole area of the part of the first heat sink 312 (the second heat sink 322) which corresponds to the first heat pipe 314 (the second heat pipe 324). In other words, in the heat pipes 314, 324, the second extending portions 314c, 324c are disposed inside the O-shaped openings 313f, 323f of the heat sinks 312, 322, and the parts of the bent portions 314b, 324b are disposed inside the U-shaped openings 313d, 323d of the heat sinks 312, 322.

The first cooling apparatus 310 and the second cooling apparatus 320 according to the embodiment are configured as has been described heretofore, whereby as many first fins 313 and second fins 323 as possible can be provided in the first and second heat sinks 312, 322 in such a manner as to contact the first and second heat pipes 314, 324, respectively, in the limited space inside the projector 10. As a result, the surface areas of the first fins 313 and the second fins 323 of the first and second heat sinks 312, 322 can be increased to thereby enhance the heat dissipation capability even in the limited space, thereby making it possible to make an effective use of the limited space. As a result, the first cooling apparatus 310 and the second cooling apparatus 320 can cool respectively the display device 50 and the red light source device 80, which constitute the corresponding heat sources, with good efficiency.

With the first cooling apparatus 310 and the second cooling apparatus 320, the bent portions 314b, 324b of the first and second heat pipes 314, 324 which are disposed inside the U-shaped openings 313d, 323d are in abutment with the opening edges of the U-shaped openings 313d, 323d over the whole areas of the upper surface and the lower surface. As a result, the abutment areas of the first and second heat pipes 314, 324 with the first and second fins 313, 323 can be increased to thereby enhance the heat transmission capability, thereby making it possible to enhance the heat dissipation capability even in the limited space.

With the first cooling apparatus 310 and the second cooling apparatus 320, the first heat pipe 314 has the first extending portion 314a which extends from the one end 314e1 thereof along the left-right direction, the bent portion 314b which is bent from the first extending portion 314a through about 90 degrees to the rear, and the second extending portion 314c which extends from the bent portion 314b towards the other end 314e2 along the front-rear direction and which is passed through the first heat sink 312. The second heat pipe 324 has the one-end side extending portion 324d which extends from the one end thereof obliquely rightwards to the rear, the one-end side bent portion 324e which is bent from the one-end side extending portion 324d to the right, the first extending portion 324a which extends from the one-end side bent portion 324e along the left-right direction, the bent portion 324b which is bent from the first extending portion 324a through about 90 degrees to the front, and the second extending portion 324c which extends from the bent portion 324b towards the other end 324e2 in the front-rear direction (the second direction) and which is passed through the second heat sink 322. As a result, the specific configurations of the first and second heat pipes 314, 324 can be provided which enable as many first fins 313 and second fins 323 as possible to be provided in the first and second heat sinks 312, 322 in such a manner as to contact the first and second heat pipes 314, 324, respectively, in the limited space inside the projector 10.

The bent portions 314b, 324b of the heat pipes 314, 324 are compressed in the up-down direction perpendicular to the left-right direction and the front-rear direction so as to be formed into the flat shape, whereby the upper surface and the lower surface of the parts of the heat pipes 314, 324 which are formed into the flat shape constitute the planar surface. Thus, in the event that the heat pipes 314, 324 have, for example, a circular cross section, it becomes difficult for the first and second fins 313, 323 to be brought into abutment with the first and second heat pipes 314, 324 at the corresponding bent portions 314b, 324b. However, with the first and second heat pipes 314, 324 of the present embodiment, almost the whole areas of the upper surfaces and the lower surfaces of the bent portions 314b, 324b can properly be brought into abutment with the first and second fins 313, 323 via the U-shaped opening projecting portions 313e, 323e inside the U-shaped openings 313d, 323d. As a result, the abutment areas between the first and second heat pipes 313, 324 and the first and second fins 313, 323 can be increased to thereby enhance the heat transmission capability, thereby making it possible to enhance the heat dissipation capability even inside the limited space.

With the first cooling apparatus 310 and the second cooling apparatus 320, the extending direction (the front-rear direction) of the second extending portion of the heat pipes 314, 324 is perpendicular to the extending direction (the left-right direction) of the first extending portion thereof. As a result, the first cooling apparatus 310 and the second cooling apparatus 320 can be disposed within the limited space by use of the bent portion which is bent through about 90 degrees, whereby the heat dissipation capability can be enhanced by providing as many first and second fins 313, 323 as possible in the first and second heat sinks 312, 322, thereby making it possible to make an effective use of the limited space.

With the first cooling apparatus 310 and the second cooling apparatus 320, the openings provided in the first and second fins 313, 323 constitute the U-shaped openings 313d, 323d which are opened to the left so as to accommodate the part of the bent portions 314b, 324b. As a result, the first and second fins 313, 323 can be provided even in the position which corresponds to the part of the bent portions 314b, 324b, thereby making it possible to enhance the heat dissipation capability of the heat sinks 312, 322 within the limited space.

In addition, with the first cooling apparatus 310 and the second cooling apparatus 320, the heat pipes 314, 324 are in abutment with the first and second fins 313, 323, respectively, over substantially the whole areas of the outer circumferential surfaces of the parts thereof which are disposed inside the O-shaped openings 313f, 323f via the O-shaped opening projecting portions 313g, 323g. As a result, the abutment areas between the first and second heat pipes 313, 323 and the first and second fins 313, 323 can be increased to thereby enhance the heat transmission capability further, thereby making it possible to enhance the heat dissipation capability further inside the limited space.

The light source apparatus 60 includes the first cooling apparatus 310 and the second cooling apparatus 320, the excitation light illuminating device 70 for emitting light in the blue wavelength range, the red light source device 80 for emitting light in the red wavelength range, and the green light source device 90 for emitting light in the green wavelength range. As a result, the light source apparatus 60 can be provided in which the display device 50 and the red light source device 80, which constitute the heat sources, can be cooled with good efficiency by making the effective use of the limited space.

The projector 10 includes the light source apparatus 60 described above, the display device 50 which receives the light source light from the light source apparatus 60 so as to form image light, the projection optical system 220 for projecting the image light emitted from the display device 50 onto the projection target object, and the control section 38 for controlling the display device 50 and the light source apparatus 60. As a result, the projector 10 can be provided in which the display device 50 and the red light source device 80, which constitute the heat sources, can be cooled with good efficiency by making the effective use of the limited space inside the projector 10.

Next, referring to FIGS. 7 to 9, a modified example of the present disclosure will be described. In the description of the modified example, like configurations to those of the embodiment described above will be omitted from the description or will described briefly. A first cooling apparatus 610 and a second cooling apparatus 620 according to the modified example differ from those of the embodiment described above in the configurations of a first heat sink 612 and a second heat sink 622.

Figure 7:
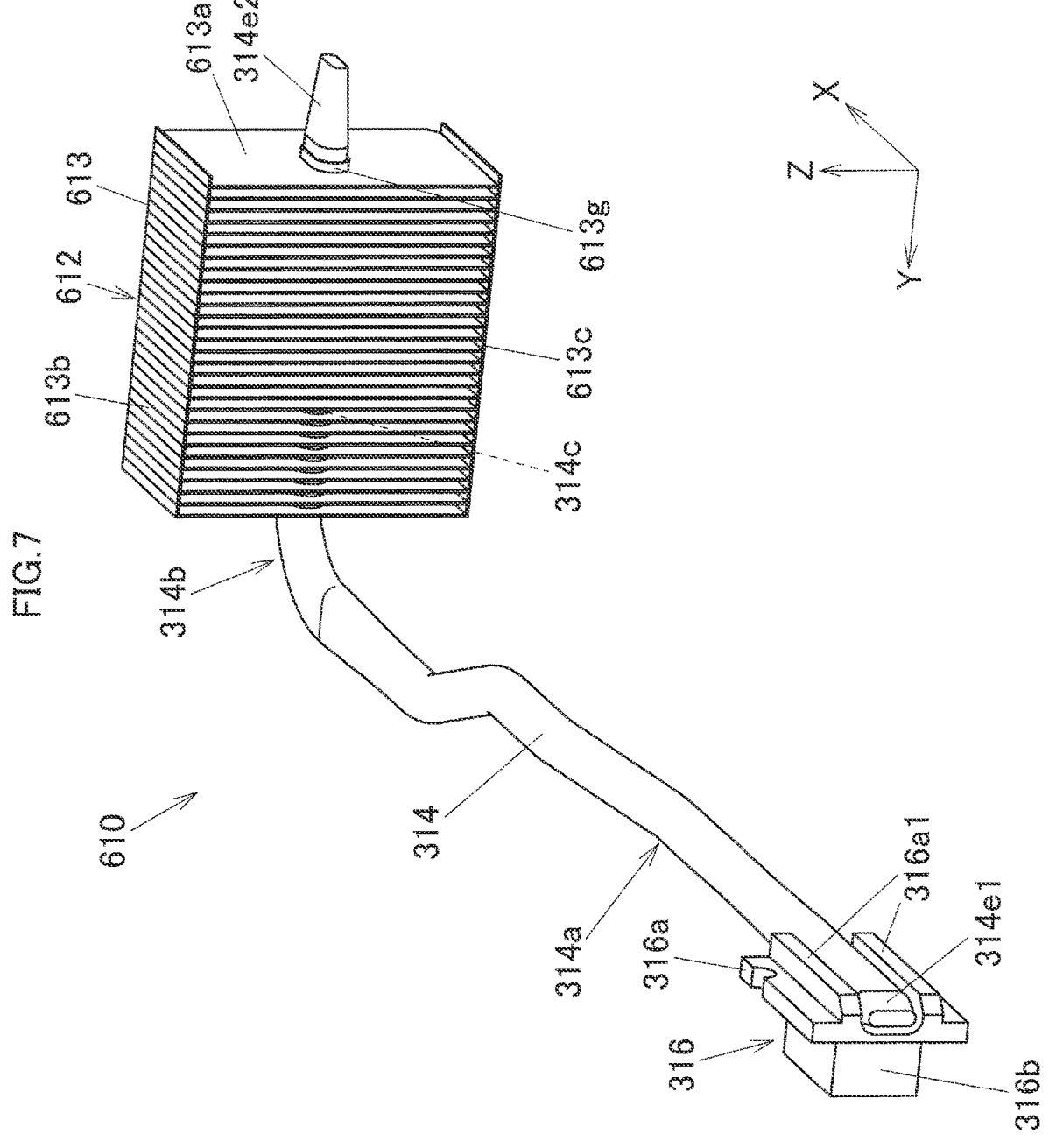
FIG. 7 is a perspective view of a first cooling apparatus according to a modified example.
Figure 8:
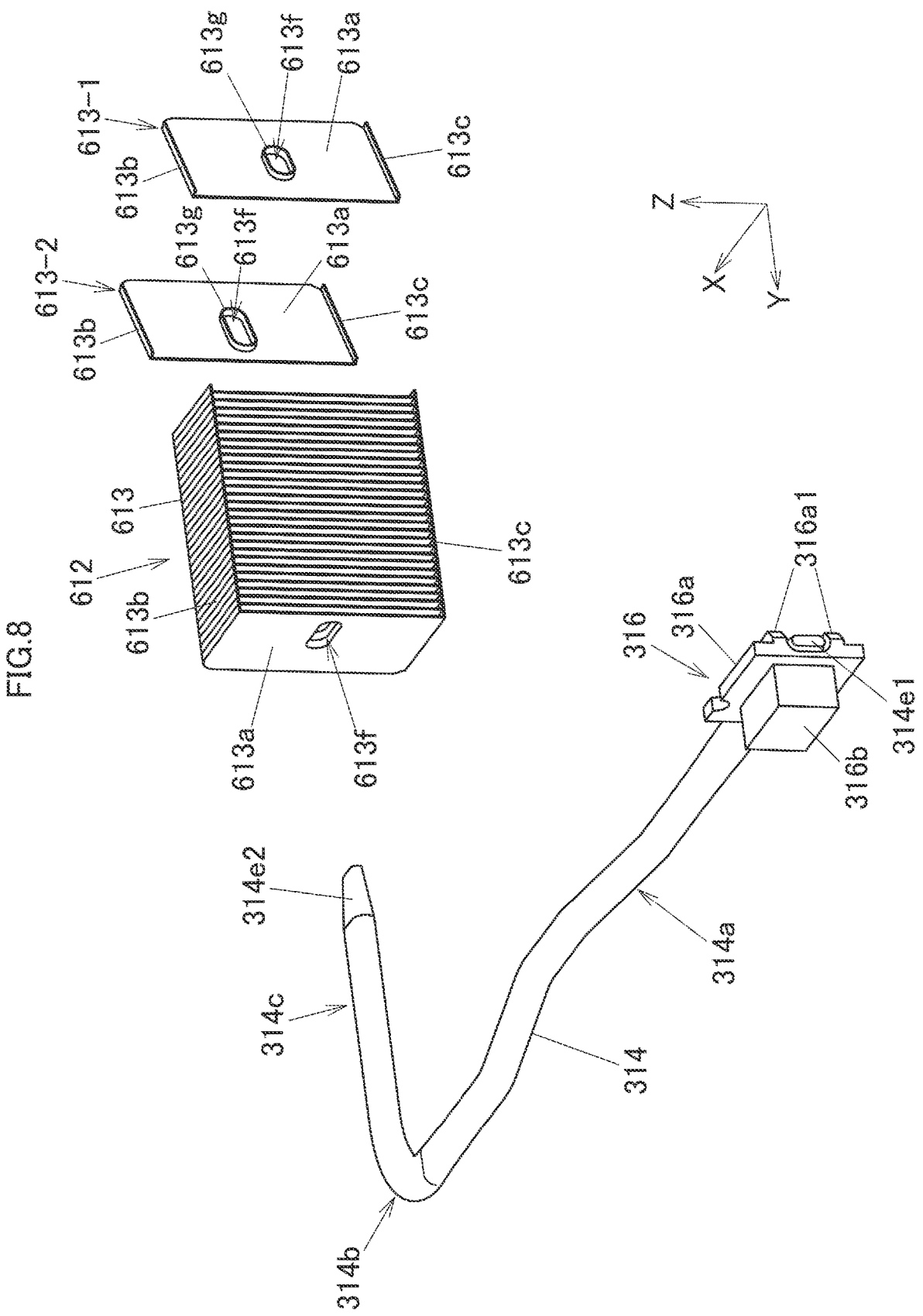
FIG. 8 is an exploded perspective view of the first cooling apparatus according to the modified example.

As shown in FIGS. 7 and 8, in the first heat sink 612 according to the modified example, a configuration is adopted in which an O-shaped opening 613_f_, which is a through-hole opened substantially into an O-shape, is provided in all first fins 613. That is, all the fins 613 which make up the first heat sink 612 each have a plate-shaped portion 613_a_, an upper projecting portion 613_b_, a lower projecting portion 613_c_, an O-shaped opening 613_f_, which is provided substantially in a central portion in the up-down direction, and an O-shaped opening projecting portion 613_g_. Here, the plate-shaped portion 613_a_, the upper projecting portion 613_b_, the lower projecting portion 613_c_, the O-shaped opening 613_f_, and the O-shaped opening projecting portion 613_g_ have the same configurations as those of the first fin 313 which has the O-shaped opening 313_f_ provided therein in the embodiment described above.

In the modified example, a first heat pipe 314 is assembled to the first heat sink 612 by passing a second extending portion 314_c_ and a part of a bent portion 314_b_ through the O-shaped openings 613_f_ which are provided in the first heat sink 612 so as to be soldered thereto. To describe this in detail, in the first heat pipe 314, a part of the bent portion 314_b_ which lies closer to a second extending portion 314_c_ is disposed inside the O-shaped openings 613_f_, and the second extending portion 314_c_ is disposed inside the O-shaped openings 613_f_ in such a manner as to contact the O-shaped openings 613_f_. In other words, in the first sink 612, the first fins 613 are provided not only in the position which corresponds to the second extending portion 314_c_ but also in the position which corresponds to the part of the bent portion 314_b_. Then, almost a whole area of an outer circumferential surface of the part of the first heat pipe 314 is in abutment with the O-shaped opening projecting portions 613_g_ of the first fins 613.

An assemblage of the first heat sink 612 and the first heat pipe 314 according to the present modified example can be realized as follows. That is, as to the O-shaped openings 613_f_ which contact the part of the bent portion 314_b_ of the first heat pipe 314, opening diameters in the left-right direction of the relevant O-shaped openings 613_f_ are changed in accordance with the degrees of bending of the bent portion 314_b_ which contacts the O-shaped openings 613_f_ (refer to two first fins 613-1, 613-2 shown in FIG. 8). In this way, the first fins 613 can be provided in the first heat sink 612 even in the position which corresponds to the part of the bent portion 314_b_ in such a state that the part of the bent portion 314_b_ is passed through the O-shaped openings 613_f_. In addition, the assemblage described above can also be realized by, for example, matching sizes of all the O-shaped openings 613_f_ with a degree of bending of the bent portion 314_b_ which is the largest in the degrees of bending of the bent portion 314_b_.

Figure 9:
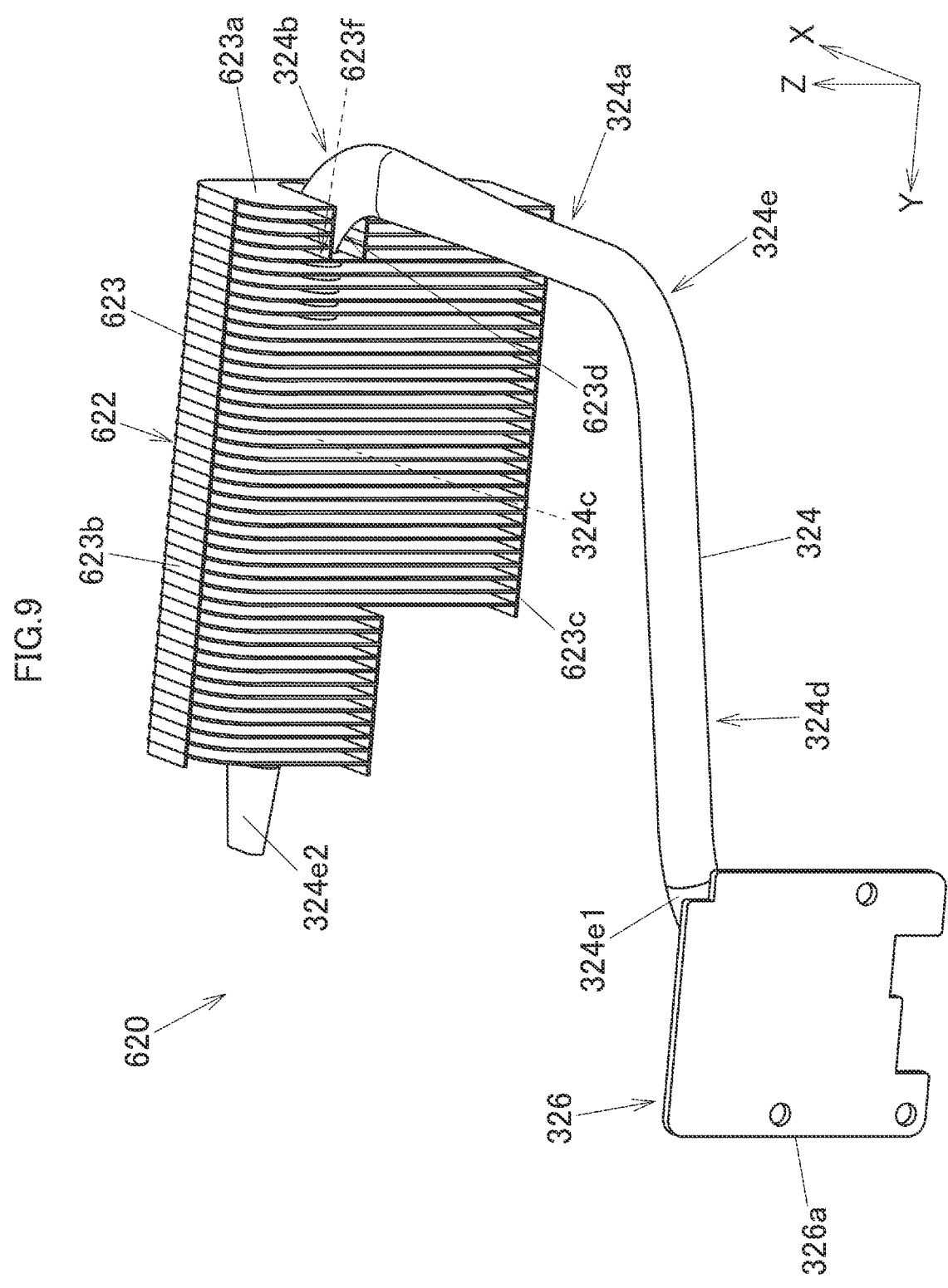
FIG. 9 is a perspective view of a second cooling apparatus according to the modified example.

In addition, as with the second heat sink 322 of the embodiment described above, the second heat sink 622 according to the present modified example has, as shown in FIG. 9, plate-shaped portions 623_a_, upper projecting portions 623_b_, lower projecting portions 623_c_, U-shaped openings 623_d_, U-shaped opening projecting portions 623_e_, O-shaped openings 623_f_, and O-shaped opening projecting portions 623_g_. In the second heat sink 622, a small number of second fins 623 each having a U-shaped opening 613_d_, which is a substantially U-shaped opening opened to the left, provided therein are continuously provided in parallel at a rear end part (a right end part in FIG. 9) thereof, and a large number of or multiple second fins 623 each having an O-shaped opening 613_d_ provided therein are continuously provided in parallel at the other part of the second heat sink 622. Thus, a larger number of second fins 623 each having the O-shaped opening provided therein are provided in the second heat sink 622 than in the second heat sink 322 in the embodiment described above.

A second heat pipe 324 is assembled to the second heat sink 622 by passing a second extending portion 324_c_ and a part of a bent portion 324_b_ through the U-shaped openings 623_d_ and the O-shaped openings 623_f_ which are provided in the second heat sink 622 so as to be soldered thereto. To describe this in detail, in the second heat pipe 324, a part of the bent portion 324_b_ which lies closer to a first extending portion 324_a_ is disposed inside the U-shaped openings 323_d_, and a part of the bent portion 324_b_ which lies closer to the second extending portion 324_c_ and the second extending portion 324_c_ are disposed inside the U-shaped openings 323_d_ and the O-shaped openings 323_f_ in such a manner as to contact the O-shaped openings 323_f_. An assemblage of the second heat sink 622 and the second heat pipe 324 can also be realized by changing opening diameters in the left-right direction of the O-shaped openings 623_f_ in accordance with degrees of bending of the part of the bent portion 324_b_ which corresponds to the O-shaped openings 623_f_, as described above.

Thus, with the first cooling apparatus 610 according to the modified example, the whole area of the part of the first heat pipe 314 which corresponds to the first heat sink 612 is disposed inside the O-shaped openings 613_f_, and almost the whole area of the outer circumferential surface of the relevant part of the first heat pipe 314 is in abutment with the O-shaped opening projecting portions 613_g_. In addition, with the first cooling apparatus 610 according to the modified example, almost the whole area of the part of the second heat pipe 324 which corresponds to the second heat sink 622 is disposed inside the O-shaped openings 623_f_ excluding the part which lies closer to the first extending portion 624_a_, and almost the whole area of the outer circumferential surface of the relevant part of the second heat pipe 324 is in abutment with the O-shaped opening projecting portions 623_g_. As a result, the abutment areas between the first and second heat pipes 614, 624 and the first and second fins 613, 623 can increased larger than in the first cooling apparatus 310 and the second cooling apparatus 320 according to the embodiment described above, thereby making it possible to enhance the heat transmission capability further. As a result, the heat dissipation capability can be enhanced further within the limited space.

The embodiment and the modified example which have been described heretofore are presented as the examples, and hence, there is no intention to limit the scope of the present invention by them. The novel embodiment and modified example can be carried out in other various forms, and various omissions, replacements and modifications can be made thereto without departing from the spirit and scope of the present invention. Those resulting embodiments and modified examples thereof are included in the scope and gist of the present invention and are also included in the scope of inventions claimed for patent under claims below and their equivalents.

For example, in the embodiment and the modified example, while the first and second fins are described as being provided even in the positions which correspond to the parts of the bent portions of the first and second heat pipes in the first and second heat sinks of the first cooling apparatus and the second cooling apparatus, the third cooling apparatus may be configured in the same way. In addition, in the embodiment and the modified example, while the first cooling apparatus and the second cooling apparatus are described as being designed to cool respectively the display device and the red light source device as the heat sources to be cooled, a cooling apparatus for cooling the green light source device or other heat sources may be configured in the same way as the first cooling apparatus and the second cooling apparatus of the embodiment and the modified example (the configuration in which the fins are provided even in the position which corresponds to the part of the bent portion).

In addition, in the embodiment and the modified example, while in each heat pipe, the extending direction (the left-right direction) of the first extending portion and the extending direction (the front-rear direction) of the second extending portion are described as being substantially perpendicular to each other, and the bent portion is described as being bent through about 90 degrees, a configuration may be adopted in which the extending direction (the left-right direction) of the first extending portion and the extending direction (the front-rear direction) of the second extending portion are not perpendicular to each other but may interest each other. In this case, the bent portion means a part defined from a point where the first extending portion of the heat pipe starts to be bent from the orientation in which the first extending portion follows the extending direction thereof towards the extending direction of the second extending portion to a point where the bending of the first extending portion ends, and the extending direction of the heat pipe follows the extending direction of the second extending portion.

What is claimed is:

1. A cooling apparatus comprising:
   a heat sink comprising multiple fins, wherein:
      a first fin of the multiple fins comprises a plate-shaped portion having a plate-like shape in which an O-shaped through-hole having a first opening diameter is provided at the plate-shaped portion;
      a second fin of the multiple fins comprises a plate-shaped portion having a plate-like shape in which an O-shaped through-hole having a second opening diameter larger than the first opening diameter is provided at the plate-shaped portion of the second fin; and
      a third fin of the multiple fins comprises a plate-shaped portion having a plate-like shape in which a U-shaped opening is provided at the plate-shaped portion;
   a heat receiving member configured to be brought into abutment with a heat source; and
   a heat pipe which extends from one end which is connected with the heat receiving member towards another end,
   wherein the heat pipe comprises a first extending portion which extends from the one end, a bent portion which is bent from the first extending portion and at least a part of which is disposed inside the U-shaped opening of the third fin, and a second extending portion which extends from the bent portion and at least a part of which is disposed inside the O-shaped through-hole of the first fin, at least a part of the bent portion is disposed inside the O-shaped through-hole having the second opening diameter of the second fin.

2. The cooling apparatus according to claim 1, wherein the bent portion which is disposed inside the U-shaped opening is in abutment with opening edges of the U-shaped opening at least at a part thereof.

3. The cooling apparatus according to claim 1, wherein the heat pipe comprises the first extending portion which extends from the one end along a first direction, the bent portion which is bent from the first extending portion along a second direction which intersects the first direction, and the second extending portion which extends from the bent portion along the second direction.

4. The cooling apparatus according to claim 3, wherein the bent portion has a flat shape which results from being compressed in a direction perpendicular to the first direction and the second direction.

5. The cooling apparatus according to claim 3, wherein the second extending portion has a flat shape which results from being compressed in a direction perpendicular to the first direction and the second direction.

6. The cooling apparatus according to claim 3, wherein the second direction is perpendicular to the first direction.

7. The cooling apparatus according to claim 1, wherein the U-shaped opening is opened in one direction at a location where at least a part of the bent portion is disposed.

8. The cooling apparatus according to claim 1, wherein the U-shaped opening constitutes through-holes at a location where at least a part of the bent portion is disposed.

9. The cooling apparatus according to claim 1, wherein the heat pipe is brought into abutment with the heat sink over substantially a whole area of an outer circumferential surface of a location thereof where the heat pipe is disposed inside the O-shaped through-hole of the first fin.

10. The cooling apparatus according to claim 1, wherein the first fin of the multiple fins further comprises:
      an upper projecting portion which is bent from an upper edge portion of the plate-shaped portion through about 90 degrees towards one surface side of the plate-shaped portion so as to project therefrom; and a lower projecting portion which is bent from a lower edge portion of the plate-shaped portion through about 90 degrees towards the one surface side of the plate-shaped portion so as to project therefrom.

11. The cooling apparatus according to claim 1, wherein the third fin of the multiple fins further comprises:

the U-shaped opening being provided at a substantially central portion in one direction;

an upper projecting portion which is bent from an upper edge portion of the plate-shaped portion through about 90 degrees towards one surface side of the plate-shaped portion so as to project therefrom; and a lower projecting portion which is bent from a lower edge portion of the plate-shaped portion through about 90 degrees towards the one surface side of the plate-shaped portion so as to project therefrom.

12. The cooling apparatus according to claim 11, wherein a U-shaped opening projecting portion is provided at an opening edge of the U-shaped opening, the U-shaped opening projecting portion being bent through about 90 degrees towards the one surface side of the plate-shaped portion so as to project therefrom.

13. The cooling apparatus according to claim 10, wherein the first fin has the O-shaped through-hole provided at a substantially central portion in one direction of the plate-shaped portion of the first fin.

14. The cooling apparatus according to claim 13, wherein an opening projecting portion is provided along the O-shaped through-hole of the first fin, the opening projecting portion being bent through about 90 degrees towards the one surface side of the plate-shaped portion of the first fin so as to project therefrom.

15. The cooling apparatus according to claim 13, wherein a part of the bent portion is disposed inside a plurality of O-shaped through-holes and opening diameters of the O-shaped through-holes change in accordance with degrees of bending of the part of the bent portion which is disposed inside the O-shaped through-holes.

16. The cooling apparatus according to claim 12, wherein projecting lengths of the upper projecting portion, the lower projecting portion, and the U-shaped opening projecting portion are substantially identical.

17. The cooling apparatus according to claim 14, wherein projecting lengths of the upper projecting portion, the lower projecting portion, and the opening projecting portion are substantially identical.

18. A light source apparatus, comprising:

the cooling apparatus according to claim 1; and a light source configured to emit light having a wavelength in a red wavelength range, light having a wavelength in a blue wavelength range, and light having a wavelength in a green wavelength range.

19. A projector, comprising:

the light source apparatus according to claim 18;

a display device configured to receive light source light from the light source apparatus and form image light;

a projection optical system configured to project the image light emitted from the display device onto a projection target object; and a control section configured to control the display device and the light source apparatus.

20. The cooling apparatus according to claim 1, wherein the first opening diameter and the second opening diameter vary in size in the left-right direction depending on the degree of bending of the bent portion.

*    *    *    *    *